(12) United States Patent
Fey et al.

(10) Patent No.: US 7,378,227 B2
(45) Date of Patent: May 27, 2008

(54) METHOD OF MAKING A PRINTED WIRING BOARD WITH CONFORMALLY PLATED CIRCUIT TRACES

(75) Inventors: Edmond Otto Fey, Vestal, NY (US); Raymond Thomas Galasco, Vestal, NY (US); Thomas Richard Miller, Endwell, NY (US); Anita Sargent, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 10/969,684

(22) Filed: Oct. 20, 2004

(65) Prior Publication Data

US 2005/0058945 A1    Mar. 17, 2005

Related U.S. Application Data

(62) Division of application No. 10/119,489, filed on Apr. 9, 2002, now Pat. No. 6,815,126.

(51) Int. Cl.
*G03F 7/00*  (2006.01)

(52) U.S. Cl. .................. 430/311; 430/313; 430/315

(58) Field of Classification Search ........... 430/313, 430/315
See application file for complete search history.

(56) References Cited

U.S. PATENT DOCUMENTS

| | | | | |
|---|---|---|---|---|
| 3,828,425 A | * | 8/1974 | Manus ..................... | 29/840 |
| 4,436,806 A | * | 3/1984 | Rendulic et al. .......... | 430/311 |
| 4,528,259 A | * | 7/1985 | Sullivan .................. | 430/312 |
| 4,790,912 A | | 12/1988 | Holtzman et al. .......... | 204/15 |
| 4,945,029 A | * | 7/1990 | Bronnenberg ............. | 430/316 |
| 5,028,513 A | * | 7/1991 | Murakami et al. .......... | 430/315 |
| 5,072,283 A | * | 12/1991 | Bolger .................... | 257/676 |
| 5,262,041 A | | 11/1993 | Gulla ..................... | 205/125 |
| 5,525,204 A | * | 6/1996 | Shurboff et al. ........... | 205/125 |
| 5,985,124 A | | 11/1999 | Yoda et al. ............... | 205/118 |
| 6,221,229 B1 | | 4/2001 | Heerman et al. ........... | 205/125 |
| 2001/0041465 A1 | * | 11/2001 | Szalay et al. ............. | 439/67 |

* cited by examiner

*Primary Examiner*—Mark F. Huff
*Assistant Examiner*—Caleen O Sullivan
(74) *Attorney, Agent, or Firm*—James A. Lucas; Driggs, Hogg, Daugherty & Del Zoppo

(57) ABSTRACT

A PWB or multilayer board with circuit traces is treated by a process that serves to reduce the incident of failure of the board. The process includes the steps of applying a thin commoning layer of copper onto a catalyzed surface of the board substrate and the circuit lines. A photoresist is then applied over the commoning layer after which the photoresist is removed only from the commoning material over the circuit lines. A thin layer of a more noble metal, such as nickel, is electrodeposited over the exposed conductive layer. This is followed by a gold layer electrodeposited over the nickel in close registry therewith. The process provides the traces with a conforming nickel/gold layer that extends down the side of the traces. This reduces the tendency of a subsequent copper etch step from undercutting the nickel/gold, thereby causing slivers that could cause short circuiting between adjacent circuit patterns.

18 Claims, 3 Drawing Sheets

METHOD OF MAKING A PRINTED WIRING BOARD WITH CONFORMALLY PLATED CIRCUIT TRACES

CROSS REFERENCE TO RELATED APPLICATIONS

This application is a division of application Ser. No. 10/110,489, filed Apr. 9, 2002, now U.S. Pat. No. 6,815,126.

BACKGROUND OF THE INVENTION

1. Field of the Invention

This invention relates to the field of printed wiring boards and their manufacture. More particularly, it relates to the production of double-sided printed wiring boards. The present invention relates to a method for an improved reliability surface finishing process.

2. Discussion of Related Art

In the manufacture of printed circuit boards, also called printed wiring boards, it is now commonplace to produce circuitry on both sides of a rigid or flexible substrate. Multilayer printed wiring boards consist of alternating layers of insulating substrate material and conductive metal. The exposed outer surfaces, as well as the innerlayers, of the structure are provided with circuit patterns. The most common metallurgy selected for the circuit patterns is copper.

In double-sided and multilayer PWBs, it is necessary to provide surfaces for subsequent assembly processing. The most common surface finish is the application of a solder mask onto some circuit patterns and an organic surface protection (OSP) onto others. The OSP serves two purposes; the first being to delay the oxidation of the surface metallurgy to extend the shelf-life of the panel between shipping and assembly so that additional cleaning or oxidation removal steps are prevented; the second is that the OSP improves the wettability of the metal surface for subsequent soldering operations. Other surface metallurgies can be applied to the PWB depending upon the components to be assembled. These metallurgies include gold and palladium generally with an underlying layer of nickel that provides a diffusion barrier layer between the copper and surface metal. While these metallurgies can also be used for a solderable surface, they are more suited to providing a highly conductive surface for subsequent connector systems. Of particular interest for this invention is the method for providing these additional metallurgies.

The surface finish metallurgies are generally applied by plating processes. Most common in the industry are electroless and electrolytic plating. Electroless plating is done without electricity. The advantage of an electroless process is that circuit patterns can be formed onto a PWB and immersed into the electroless solutions to deposit metal onto exposed circuit patterns. To prevent deposition on undesired areas, photolithographic processes or masking can be used.

To provide an electrolytic metal deposition, one needs a commoning layer on the surface to be metallized to provide electrical contact. If the PWB had been fabricated using electrolytic plating processes, a commoning layer is generally present, is used for all subsequent plating, and is removed during one of the final steps. A disadvantage to this method is that as dissimilar metals are applied, the final commoning layer etch exposes these dissimilar metals in contact with each other to an electrolyte solution. When this happens, a galvanic cell is generated that accelerates the etch rate of the less noble metal. In this case, the circuit pattern would etch faster than the surface finish metal. This can produce an undercut of the surface metallurgy causing it to produce metal overhanging the underlying circuit pattern, which can flake off and contact adjacent circuit patterns causing an electrical short. The industry refers to this phenomenon as "slivering".

For a PWB fabricated using an electrolytic double-sided plating process, a commoning layer is provided on both surfaces of the PWB substrate. In the industry, this method is performed by first electrolytically pattern plating a first copper layer over a commoning layer. A photoresist is then applied after the commoning layer is formed. While leaving the pattern photoresist on the panel, subsequent electrolytic metallizations can take place. However, in some operations, the process is a full panel plate with subtractive etching to form the circuit traces. As a result, there is no commoning layer on the panel's surfaces as the copper is etched to the laminate substrate surface.

The two primary methods in the industry for pattern plating are pattern electroplate and pattern electroless plating.

In pattern electroplate, holes are drilled through or into a copper clad dielectric substrate to form through holes (extending from one planar surface of the substrate to the other) or vias (extending in from one surface but terminating within the substrate) followed by plating a commoning layer of copper onto the surface of the board. A commoning layer is an electroless copper applied over a PdSn catalyst layer. For one such process, the substrate is copper clad on at least one of its surfaces and the process employed would be a subtractive process whereby the unwanted copper is removed by chemical etching or laser ablation. The substrate typically is nonconductive, and may be provided with through holes or vias.

Because the holes extend into or through the dielectric, which is an insulator, a continuous electrical connection is first created by putting a thin metallization of copper in the holes. A photoresist is applied over the commoning layer and a pattern is formed in the photoresist through known photolithographic techniques (expose, develop) such that the open channels in the photoresist are the places where circuit traces will be formed. The substrate is then electroplated with copper, and metallization build-up only occurs in the open channels to form circuit traces. A layer of tin/lead is plated over the copper traces, followed by stripping of the photoresist and etching of the commoning layer with the copper traces protected by the tin/lead during the etch. Then the tin/lead is etched off. The result is a PWB with copper circuit traces onto which a solder mask is later placed.

It should be observed that the copper clad substrate can be any thickness, limited only to the handling capability of the fabricator. Very thin cores (approx. 5-8 mils) with laser drilled holes and vias up to multilayer boards (MLB) composites or 300+ mils and mechanically drilled holes and vias can be processed if equipment permits. The commoning layer is generally thin, about 100 microinches, and is usually applied with an electroless strike. It can also be applied by sputter coating. The photoresist can be any of the many available for copper plating in the industry. Likewise, the expose and develop chemistries are industry known. The subsequent copper plating can be direct current (DC) or pulse plated. Pulse plating provides the advantage of a more even distribution, less thieving area needed and better 'throw' into the drilled holes. DC is the most common, but has the drawbacks of non-uniform plating on isolated features and not very good throw in high aspect ratio (length to diameter) holes. Once the panel has been pattern electroplated, the commoning layer is still present under the photoresist and opens up several finishing options:

1. If tin/lead (solder) is desired on certain areas of the board, then prior to etching off the tin/lead in the last step, a photoresist/mask is applied to protect those areas during the tin/lead etch process. The mask is then removed 2. If gold is desired, for instance, on the land grid array pads, then after copper plate and tin/lead plate, a second photoresist/mask is applied, leaving open the features to be gold plated bearing in mind that the first pattern plate resist is still on the board. The tin/lead is etched off the pads, leaving a copper surface. Then the board is electrolytically nickel/gold plated, the second photomask is stripped, the first photomask is stripped either simultaneously or subsequently, the commoning layer is etched off, creating the galvanic cell phenomenon seen by the industry as slivering, and then the tin/lead is etched off.

3. These steps can be extended further. For example, if tin/lead areas are needed on a board with gold, another photomask operation is carried out. If there are requirements that the gold be thick in one place and thin in another, again, masking and plating operations are performed as long as the base commoning layer is still present.

A similar pattern plate option is practiced called 'semi-additive', the difference being that, instead of an electrolytic plating to create the traces in the patterned resist, a full-build electroless process is used. Since the commoning layer is still present, all of the aforementioned finishing processes can be carried out.

Still another pattern plate process is a full-build electroless process. In this process, there is no base copper clad panel and no commoning layer. The substrate surface is catalyzed with a palladium seed, and the photoresist is applied directly to this surface and patterned. The electroless plating builds up additively to create the traces. Since there is no commoning layer, if it is desired to continue with precious metal or tin/lead plating, this plating also has to be electroless.

Electroless gold is advantageous for wire bonding, but is not good for LGA pads or connector fingers where a 'hard' gold is needed. Solder paste can be used for places that need tin/lead.

The other method to create a PWB is the standard 'print and etch' process. In this process, the drilled substrate is plated with copper, a negative photoresist is applied and patterned, the panel is then etched such that the areas opened in the photoresist are etched away and the covered areas are protected. Again, there is no commoning layer, so to finish a board with hard gold requires a method, such as personalizing one side of the substrate only, so that the other side is left copper clad. The copper clad side acts as a commoning layer for a single sided gold plate. The gold plated side is then subsequently covered with a photoresist and the copper clad side is patterned and etched.

The problem with the first 'base process' is that the nickel and gold are plated onto the copper with the photoresist in place. Hence, the process is 'non-conformal' in that it does not plate the sidewalls of the copper features. When the commoning layer is etched, the more noble nickel/gold layer will not be etched but the underlying copper features and commoning layer will. When two dissimilar metals are in contact with one another, a galvanic cell is created upon exposure to an ionic solution. In this galvanic cell, the less noble metal (copper) acts like the anode and is preferentially etched while the more noble metals (nickel and gold) are the cathode. This is the same analogy as the rivets in the hull of a ship. If the rivets are a different metal than that of a ship hull, the rivets will corrode when exposed to seawater. In the circuit board, the galvanic etch acts to undercut the copper feature leaving a nickel/gold overhang which can subsequently break off and form a 'sliver'. This sliver of conductive metal can then cause shorting of the circuits on the PWB.

Various techniques for PWB manufacture are described in the following patents.

U.S. Pat. No. 4,790,912 describes a selective plating process where, after a photolithographic process produces electrical tracings of copper, then tin/lead alloys may be coated upon at least part of the copper tracings.

U.S. Pat. No. 5,028,513 describes a process for producing a printed circuit board by pattern plating wherein, after copper traces are formed, additional metal such as solder, copper, nickel, gold, or other metal is deposited on the tracings.

U.S. Pat. No. 5,262,041 describes additive plating wherein a flash metal is deposited onto a substrate, followed by application of a resist. Windows are left open in the resist to the flash metal after which additional metal is deposited within the windows.

U.S. Pat. No. 5,985,124 describes nickel or nickel alloy electroplating wherein at least a partially masked electrical circuit has nickel metal deposited hereon. This may be followed by plating with gold or other precious metal.

U.S. Pat. No. 6,221,229 describes a method for forming metal conductor patterns. After metal circuit lines are formed and any excess metal is removed by laser ablation, additional metals are electrolytically deposited onto at least a portion of the circuit lines.

BRIEF DESCRIPTION OF THE INVENTION

An objective of the present invention is to meet customer needs for a printed wiring board (PWB) with electrolytic gold and other multiple surface finishes.

Another objective is a printed wiring board that does not require a non-metallic conductive coating.

Yet another objective is a pattern plated structure having a layer of hard gold electrodeposited on the circuit pattern.

In this novel invention, a method is used to provide the desired electrolytic metallizations and obtain a novel structure.

Still another objective is the use of a conductive commoning layer that is applied on top of a preformed circuitry without the need to be customized for each different circuit pattern, which is applied after the solder mask and not before, and which can be applied in very thin layers, being independent of the thickness of the circuitized layer.

These and other objects and advantages, which will become readily apparent, are achieved in the manner herein described.

The invention relates to a method of making a printed wiring board without forming slivers, comprising the following steps. The board is provided having thin circuit lines thereon. A thin conductive commoning layer is applied over the board substrate and over the thin circuit lines on the surfaces of the substrate. This layer may be a flash plate of a metallic layer, typically copper, having a thickness of between about 15 and about 200µ inches. A photoresist is then applied over the thin commoning layer after which the photoresist is removed from the commoning layer over the circuit lines. Preferably, the openings in the photoresist are sufficiently wide to expose the sidewalls of the circuit lines as well as the top surface. A thin layer of a noble metal is electrodeposited as a conforming layer over the exposed commoning layer. This more noble metal can comprise a first electrodeposit of nickel followed by a gold layer applied over the nickel in precise registry therewith. Instead, other metals, such as platinum, cobalt, silver, tin and its alloys may be applied over the commoning layer. Prior to the application of the commoning layer over the substrate and the thin circuit lines, a solder mask may be applied over any portion or portions of the circuit lines on which the thin conductive layer is not required. This is followed by the step of applying a seed catalyst layer over the solder mask and over the surfaces of the substrate that are not covered by the solder mask.

The invention also relates to a method of manufacturing a printed wiring board having a circuitized metal electrodeposit on both sides thereof. The method comprises the following steps. At least one continuous metallization layer is formed on each side of the printed wiring board. This metallization layer may be copper or a tin/palladium colloid depending on whether the circuit traces are to be formed by electrolytic pattern plating or by a full build electroless pattern plating process. Further, the conductive circuit traces may be created on each metal layer by removing unwanted metal, for example by etching. Then, any traces not requiring a selective layer of a more noble metal are masked over with a solder mask. A seed catalyst layer is applied over the entire surface, including the areas that are masked, after which a commoning layer of copper is plated to a thickness of between about 15 and about $200\mu$ inches over the seed catalyst layer. The adhesion between the solder mask and the seed catalyst can be enhanced by roughening the surface of the mask before applying the seed catalyst. The commoning layer is then exposed over the circuit traces to be plated followed by electroplating of a conforming layer of a more noble metal over the exposed commoning layer over the circuit traces. The more noble metal can be a first layer of nickel, and a layer of gold electroplated over the nickel. Other more noble metals, such as platinum, cobalt, silver, tin and its alloys may be applied over the commoning layer instead of the nickel/gold. This is followed by stripping the photoresist layer and etching away the commoning layer between the traces. The commoning layer is exposed by applying a photoresist film over the layer and then exposing and developing the film to create openings through the film to the commoning layer over traces to be plated. Etching, as with a laser beam or other radiation, exposes the openings through the film. The photoresist is then stripped off and the commoning layer that is not protected by the nickel/gold is removed as by etching.

The invention also relates to a printed wiring board prepared according to the following steps: a) providing a substrate having thin circuit lines thereon; b) applying a thin conductive commoning layer on the substrate and the thin circuit lines; c) applying a photoresist over the commoning layer; d) processing the photoresist to expose only the commoning layer over the circuit lines to be processed; and e) applying a more noble metal over the exposed commoning layer. The panel is circuitized by any of the methods previously discussed but only to the point at which there are copper features on the panel. Then a solder mask is applied on those features that will remain SMOBC (solder mask over bare copper). This is followed by a thin commoning layer over the entire panel and the solder mask. The commoning layer is copper deposited by electroless plating or by sputter coating. A photoresist is applied to the panel and those features needing gold plating are exposed. Care must be taken not to make the opening too wide to avoid plating onto the commoning layer between copper features, while still fully exposing the features that are to be plated. This can be achieved by using a laser to ablate or develop the resist over the features inside of an expose machine. The more noble metal, typically nickel/gold, is then plated in the openings. Multiple finishes again require multiple photolithography steps. When finished, the photoresists are stripped off and the exposed commoning layer is etched.

The invention also relates to a circuit trace deposited onto a printed wiring board or a multiple layer wiring board. The circuit trace comprises copper having a rectangular or a trapezoidal cross sectional shape and having a layer of a more noble metal deposited thereon and conforming to the surface thereof. The copper comprises a laminate of a copper foil on the wiring board, a copper flash, copper electrodeposit and a commoning layer. The commoning layer has a thickness of between about $15\mu$ inches and about $200\mu$ inches. Typically, the commoning layer is deposited by electroless plating or sputter coating. The more noble metal comprises a nickel electrodeposit on the copper commoning layer and a gold electrodeposit on the nickel. Alternatively, the more noble metal can comprise other metals, such as platinum, cobalt, silver, tin and its alloys.

DETAILED DESCRIPTION OF THE INVENTION

A number of procedures may be used to prepare a PWB substrate which is used as the starting structure for the present invention. One such procedure utilizes full panel plating and subtractive etching. In this procedure, the substrate comprises an inner plane or multiple planes if the substrate is a multiple layer board (MLB). The inner plane is sandwiched between dielectric layers, generally of the FR-4 family of epoxy resins. The top and bottom surfaces of the substrate are covered with a copper foil laminated to the substrate using heat and pressure. One or more holes are drilled into and through the layer to form, respectively, vias and through holes. A metallization layer of, e.g., copper, is then applied over the foil and along the side of each hole. This is achieved by a combination of one or more cycles of electroless flash plating and electroplating. Following this, a photoresist is applied over the metallized surface, also covering the holes and vias. Portions of the resist are then exposed to light, actinic radiation, or a laser beam and are developed to form a pattern of covered areas in the resist conforming to the circuit patterns or traces, and open spaces between the traces. The metallized layer and foil are then removed by etching or other suitable means from the exposed surfaces of the substrate where the photoresist had previously been removed. Then the remaining photoresist is stripped off to leave a pattern of copper circuit traces.

Figure 1:
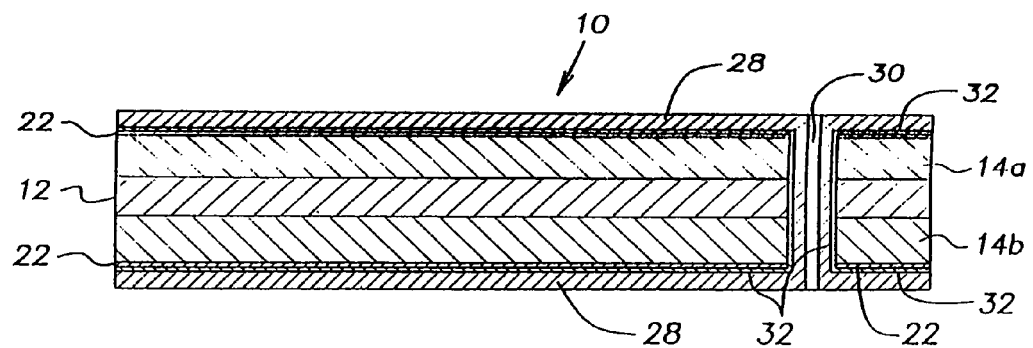
FIG. 1 is a cross-sectional view of a printed wiring board with a full panel plate.

Turning now to the drawings, FIG. 1 shows a conventionally prepared substrate 10 comprising an inner plane 12 sandwiched between layers 14a, 14b of a dielectric material, such as a cured epoxy resin that can be fiber glass filled, particle filled or non-glass fiber filled, polytetrafluoroethylene, or other organic materials known to the industry. It is understood that for a multilayer board, the substrate 10 shown in FIG. 1 would have multiple inner planes and dielectric layers. The substrate 10 is clad in copper 22 on the top surface and copper 22 on the bottom surface. The copper cladding is typically a thin foil that is laminated to the substrate by procedures which are well-known in the art. A hole 30 is shown extending between the top and bottom surfaces. It is understood that the substrate can have a plurality of holes. Because the dielectric material in the drilled holes is nonconductive, it is necessary to provide an electrical connection for plating. At this point, the substrate surfaces and hole 30 are metallized with a thin coating of the copper layer 32. A thicker layer of copper 28 is electrodeposited on top of the foil as well as the interior side walls of hole 30.

Figure 2:
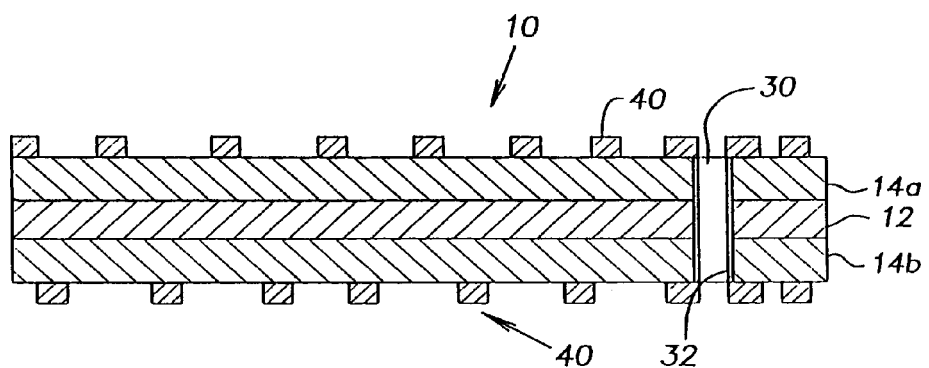
FIG. 2 shows a printed wiring board (PWB) after printing and etching.

FIG. 2 shows a PWB substrate after performing print and etch operations wherein portions of the copper has been etched away to form a plurality of circuit traces 40. These circuit traces 40 are present on the top and bottom surface with no commoning layer. Although the structure is shown having circuit traces with a rectangular shape, it is understood that this is a representation for the figures; however, a PWB made from a full build electroless copper process would exhibit rectangular circuit traces. For the etching process used, the circuit traces have a trapezoidal shape as known in the industry rather that the "apple core" shape that results from pattern plating. Although not shown in the figures, the circuit traces also exhibit the intermediate plating steps of the plater whereas the pattern plater would not have these. Up to this point, the processing steps are conventional, and are well-known in the art.

Figure 3:
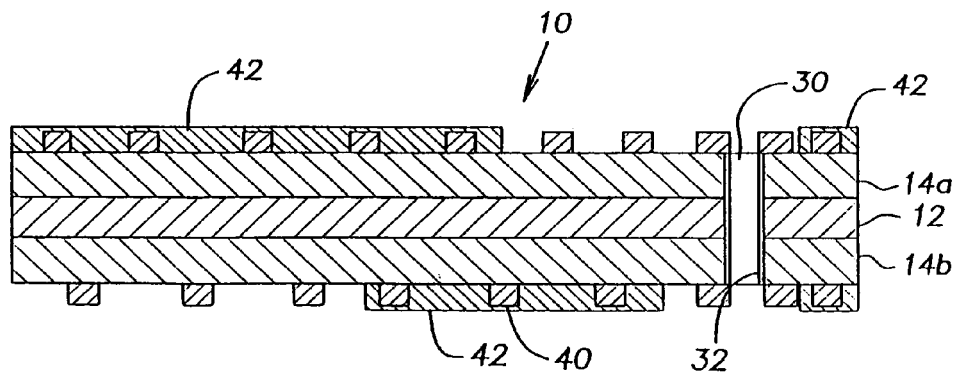
FIG. 3 shows a solder mask in place.

FIG. 3 shows a solder mask 42 applied over some but not all of the circuit traces 40 on the top and bottom surfaces of the PWB. The selection as to which traces are to be covered and which are not to be covered is within the discretion of the circuit board designer. Typically, the solder mask is used to encapsulate all surfaces of the panel on which the commoning layer is not desired. A preferred solder mask is an organic high molecular weight resist layer. The layer is an acid resistant, negative photoresist, such as a photopolymerizable compound having an ethylenically unsaturated terminal bond, including compounds such as acrylic esters and methacrylic esters of polyhydric alcohols. If a universal plate is desired, the solder mask step is omitted.

It is now desired to create a conductive layer over the entire panel surface to be used as a commoning layer for subsequent electroplating. A catalyst layer (not shown) is applied over the solder mask as well as any surfaces that are not covered by solder mask. The solder mask may be roughened prior to the catalyst deposition to improve the adhesion of the catalyst to the underlying surface. The catalyst typically is a tin/palladium colloid prepared by the reduction of the palladium metal in an acid medium. The colloid is applied by immersion of the PWB or the MLB in the catalyst medium for a period from 1-10 minutes at a temperature from ambient to 150° C. to allow adsorption of the catalyst. It is understood that ionic catalyst chemistries can be used as well as other methods such as Cr sputter.

Figure 4:
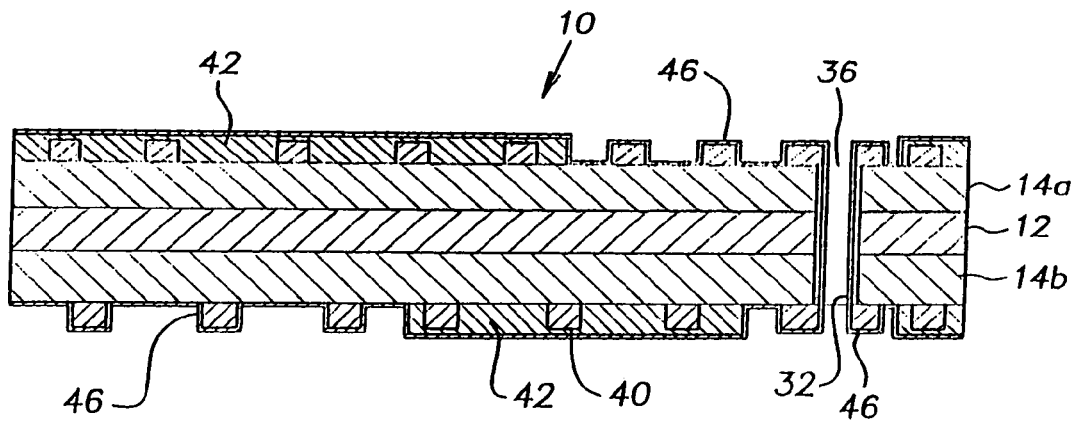
FIG. 4 shows a commoning layer applied over the solder mask and over all exposed circuit patterns of FIG. 3.

A very thin layer of copper 46, between about 15 and about 200µ inches in thickness, flash plated or otherwise plated over the top and bottom surfaces of the panel, is shown in FIG. 4. The flash layer covers the entire surface of the board that is covered by the catalyst, including the solder mask. This layer of copper 46 now forms the commoning layer.

It is also understood that a commoning metallization layer can also be deposited by other techniques well known in the industry, such as sputtering, mag-ion, or other similar methods. For the embodiment being discussed, commoning layer thicknesses of 15-25 microinches was used due to the fine circuitization requirements. The highest benefit of this invention is derived by the ability to plate a very thin commoning layer so that subsequent etching of the commoning layer removes the thin layer rapidly. For most metallization methods used for the commoning layer, there is a minimum thickness that must be used to achieve a continuous electrical layer. For methods most common in the industry, this occurs at approximately 15µ inches, but is affected by the topography and planarity of the substrate. For substrates having a varied topography because of the circuit patterns and solder mask areas, or because of excessive board warpage, a thicker commoning layer may have to be used to achieve a continuous electrical layer. It is understood that, as the technology advances, it may be possible to achieve a continuous electrical layer with a thinner commoning layer. Such thinner layers are contemplated as being within the scope of the present invention.

Figure 5:
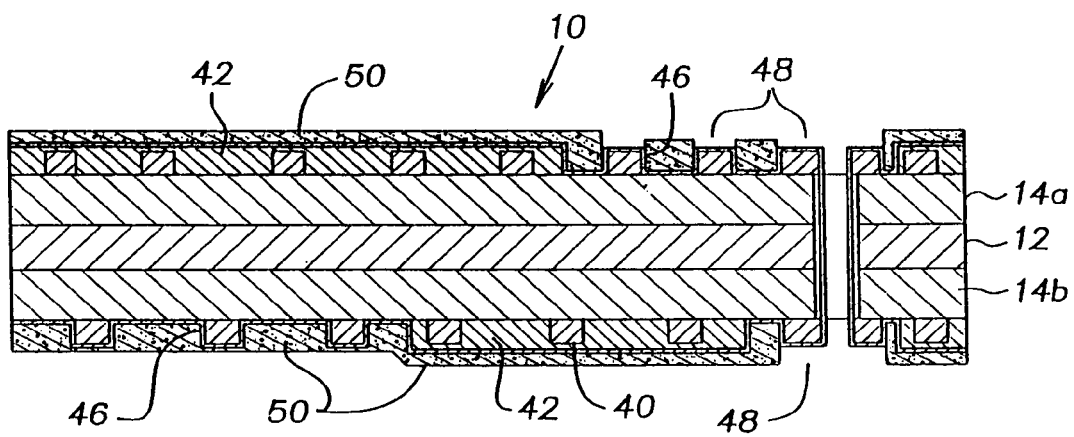
FIG. 5 shows a patterned photoresist.

The next step involves applying a photoresist/mask over the surfaces of the commoning layer, leaving open any copper features that are to be subsequently plated. This feature is shown in FIG. 5. In this figure, the photoresist/mask 50 is applied to both surfaces of the substrate over the commoning layer 46. Any of the copper covered features 48 that are to be subsequently plated are intentionally left uncovered.

Figure 6:
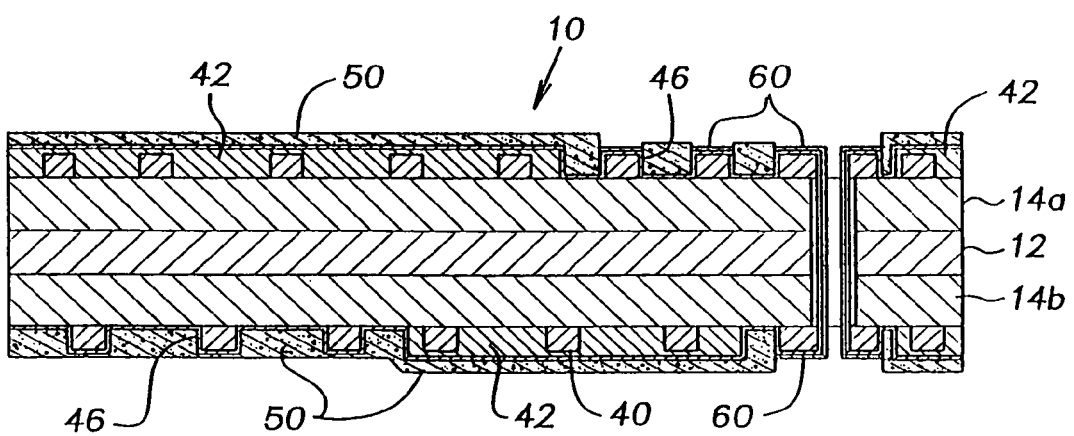
FIG. 6 shows a plate of noble metal on the circuit traces.

Turning now to FIG. 6, a layer of a more noble metal 60 than that of the commoning layer is deposited upon the exposed portions 48 of the copper traces. When copper is used as the commoning layer, any of the more noble metals disclosed in prior art patents, such as U.S. Pat. No. 4,377,448, including zinc, cadmium, chromium, nickel, cobalt, gold, silver, palladium, platinum, ruthenium, and alloys with each other and with tin and lead, may be used. Although FIG. 6 shows one layer of the noble metal 60, it is understood that there may be at least two distinct layers. In one embodiment, the first layer is electrolytic nickel 62, and a second layer of electrolytic gold 64 is deposited thereon. An intermediate thin layer of electroless gold can also be deposited immediately after the nickel to prevent oxidation of the nickel and to enhance the adhesion of the gold electrodeposit to the nickel. Note that registration is critical so extra fiducials can be placed about the panel for precise alignment. It is desired not to plate on the commoning layer at the laminate surface but, instead, only on the circuit traces or other patterns. The advantage of this invention becomes evident at this point. The openings in the photoresist are such that the sidewalls of the circuit patterns are exposed as well as the top surface. By providing openings in this manner, subsequent plating on the circuit patterns will be conformal to the sidewalls as well as the top, eliminating potential reliability risks due to slivers and galvanic etch.

Figure 7:
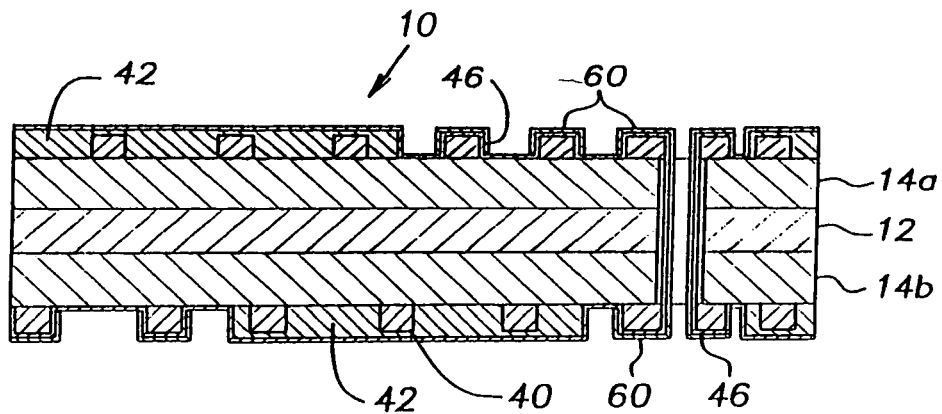
FIG. 7 shows the PWB with the photoresist stripped off.

Turning now to FIG. 7, the photoresist/masks 50 are removed. If desired, additional surface finish metallization layers can be added. Optionally, another layer of photoresist may be applied over the surfaces, again leaving exposed any areas that need a second type of metallization. Clearly, this removal and reapplication can be carried out a number of times to achieve the objective of applying different metallization layers on different portions of the printed wiring board. The difference could be in the type of the metal, the method of application, or the thickness.

Figure 8:
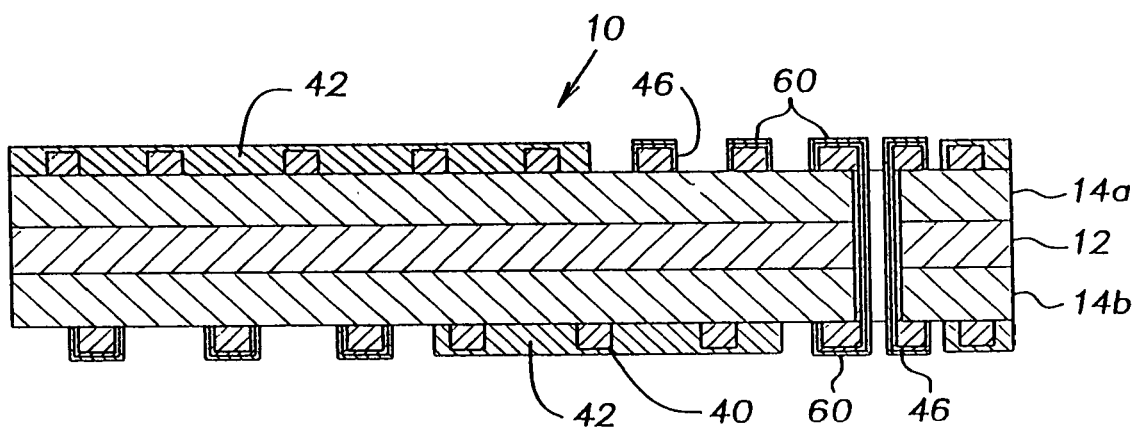
FIG. 8 shows the commoning layer etched away.

FIG. 8 shows the last step in this process. In this step, the commoning layer 46 is removed by suitable means, such as by etching, typically using an ammonical etch which is the most common one used in the industry. The etching step preferentially attacks and dissolves the exposed copper surfaces without attacking the nickel/gold or tin lead on the circuit patterns. The advantage of a conformal metallization layer is evident at this processing step. This provides additional protection to the circuit traces and is particularly useful in preventing undercutting of the precious metal layer, as previously mentioned with the prior art processes.

The nickel can be plated from a conventional Watts bath of $NiSO_4$ and $NiCl_2$, or from a nickel sulfamate bath. The plating bath can also include cobalt ions so as to deposit a nickel/cobalt alloy. Buffers, such as boric acid, and brighteners, such as saccharin, can be included as needed.

The gold can be electroplated as a bright or a matte finish from alkaline cyanide or a neutral cyanide bath. Typical plating baths are disclosed in numerous publications, including the *Metal Finishing Guidebook and Directory* published on an annual basis by Elsevier Science Publishing Co. The noble metal electroplating baths typically do not have high throwing ability. Therefore, the through holes and vias are plated with copper, but remain relatively free of these more noble metals.

The photoresist is then stripped off the panel using a suitable organic solvent. The flash layer of copper is then etched off by chemical etching using an ammoniacal etchant, cupric chloride, ferric chloride or a sulfuric acid/peroxide etchant, being careful to avoid etching the substrate. If, prior to etching the copper commoning layer, a plurality of surface finishes is desired, one need only apply additional layers of photoresist over the areas to protect or to plate.

Figure 9:
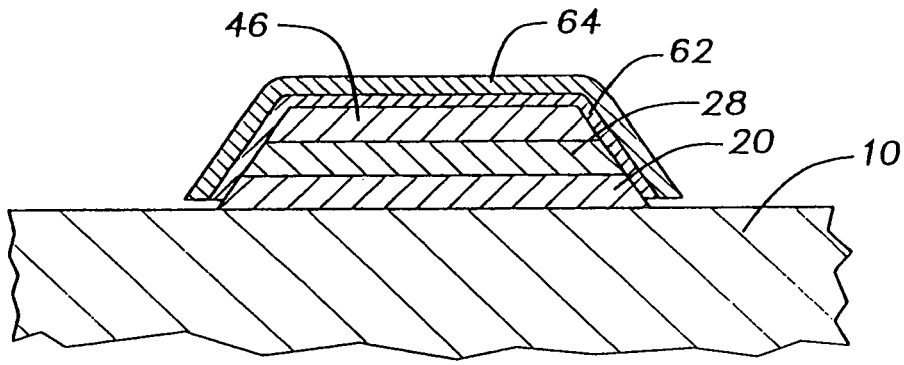
FIG. 9 is a cross sectional view of a circuit trace of the present invention.

In FIG. 9, the structural features of the circuit traces prepared by the present invention are shown. In this figure, the completed circuit lines of the present invention are shown as trapezoidal, but it is also understood that they can be rectangular instead. The substrate 10 is shown with a cross section of a circuit trace 40 comprising a first layer of copper foil 20. The second layer comprises copper electrodeposit 28 over the foil. Next is the commoning layer 46 representing a flash copper layer having a thickness of 0.2 mils or less. This is followed sequentially by the nickel layer 62 and the gold layer 64. Significantly, the nickel and gold layers form a conformal layer that covers the top and extends down the sides of the trace at least to the point at which the commoning layer is intersected. This provides a more robust circuit trace and serves to preclude undermining of the nickel/gold layer during the subsequent copper etch step.

Contrasted with this cross-section are those formed by the typical additive processes of the prior art. These are somewhat parabolic in shape, and have the layers of nickel and gold on the top only. Thus, the traces tend to be structurally weaker than those made according to the present invention. And undercutting and slivering is commonplace during the step of etching the commoning layer.

The printed wiring board useful in the teaching of the present invention typically comprises a non-conductive glass-epoxy laminate in the form of a double-sided board. The board contains a high-density pattern of circuits formed according to techniques that are well established in the art. Typical of such boards are the PWBs being used for high end server, backpanel or other mother board applications. However, all printed wiring boards produced by fabricators from cellular phone applications to the aforementioned high end server boards can utilize this process.

The specific details of PWBs and their use are known to persons of ordinary skill in the art and do not comprise a part of the present invention, except to the extent that these details and uses have been modified to become part of the present invention, and to interengage with other components of an overall system. Specific details, including the programming of individual computers or processors in which the printed wiring board of the present invention is used, are not deemed to comprise a part of the present invention. The process of this invention has been found to be particularly useful when using tooling of the type generally described as a full panel plate followed by subtractive etching to form circuit traces.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. The method of making a printed wiring board without the formation of slivers, comprising the steps of:
   a. providing a substrate having a plurality of thin circuit lines thereon;
   b. applying a solder mask over the circuit lines onto which a commoning layer is not to be applied;
   c. applying a seed catalyst layer over the solder mask and over all surfaces of the substrate that are not covered by the solder mask;
   d. applying a thin metal commoning layer of electroless copper on the substrate and on the circuit lines to a thickness sufficient to achieve electrical continuity;
   e. applying a photoresist over the thin commoning layer;
   f. removing the photoresist to expose only the portion of the commoning layer covering the circuit lines as well as the side walls of the circuit lines; and
   g. electrodepositing a conforming layer of a metal more noble than copper over the exposed commoning layer, covering the top and extending down the sides of each circuit line, at least to the point at which the conforming layer of electroless copper is intersected by the more noble metal.

2. The method according to claim 1 wherein the more noble metal electrodeposited over the exposed commoning layer is selected from the group consisting of zinc, cadmium, chromium, nickel, cobalt, gold, silver, palladium, platinum, ruthenium, and alloys with each other and with tin and lead.

3. The method according to claim 2 wherein the more noble metal comprises an electrodeposit of gold over an electrodeposit of nickel.

4. The method according to claim 3 wherein the cross-sectional shape of the circuit lines and commoning layer thereon are in the form of a trapezoid or a rectangle.

5. The method according to claim 4 wherein the nickel/gold forms a conforming layer on the top and the sides of the circuit trace and commoning layer onto which they are electroplated.

6. The method according to claim 1 wherein the photoresist is removed after deposition of the conforming layer, followed by removal of all of the exposed portions of the commoning layer.

7. The method according to claim 6 wherein one or more surface finish metallization layers may be added by patterning additional layers of photoresist before removal of the exposed commoning layer.

8. The method according to claim 1 wherein the thin circuit lines are deposited on the surface of the printed wiring board by the steps of:
   a) adhering a copper foil to the surface of the printed wiring board, and
   b) electrodepositing a layer of copper over the foil.

9. The method according to claim 8 further including forming a flash copper layer on the copper layer prior to electrodepositing said layer of copper.

10. The method according to claim 8 wherein unwanted portions of the copper foil are removed by etching prior to electrodepositing said layer of copper over the remaining foil.

11. The method according to claim 1 wherein the commoning layer is deposited to a thickness of between about 15μ inches and about 200μ inches on the substrate and the exposed circuit lines.

12. The method of manufacturing a printed wiring board having a circuitized metal electrodeposit on both sides thereof, comprising the steps of
   a. forming at least one continuous metallization layer of copper on each side of a dielectric substrate;
   b. creating circuit traces on each metallization layer by removing unwanted metal;
   c. masking over any area of any circuit trace that does not require a selective layer of a more noble metal;
   d. applying a seed catalyst layer over all masked and unmasked surfaces;
   e. flash plating a commoning layer of copper to a thickness between about 15μ inches and about 200μ inches over the seed catalyst layer;
   f. applying a photoresist film over the commoning layer;
   g. removing the photoresist film to expose the commoning layer over circuit traces to be plated;
   h. electrolytically plating a conforming layer of the more noble metal than that of the commoning layer over the exposed commoning layer, covering the top and extending down the sides of each circuit line, at least to the point at which the conforming layer is intersected by the more noble metal;
   i. stripping the photoresist; and
   j. removing the commoning layer between the circuit traces.

13. The method according to claim 12 wherein the seed catalyst is a tin/palladium catalyst.

14. The method according to claim 12 further including the step of roughening the surface of the mask before applying the seed catalyst.

15. The method according to claim 12 wherein the commoning layer is exposed over the circuit traces to be plated by exposing and developing the photoresist film with a laser beam or a collimated light source to create openings through the film to the commoning layer.

16. The method according to claim 12 wherein the more noble metal is selected from the group consisting of zinc, cadmium, chromium, nickel, cobalt, gold, silver, palladium, platinum, ruthenium, and alloys with each other and with tin and lead.

17. The method according to claim 12 wherein the circuit traces are formed by the additional step of electrodepositing a layer of copper on the created circuit traces prior to masking of the circuit traces.

18. The method according to claim 17 further including forming a flash copper layer over the circuit traces prior to electrodepositing the copper layer over the circuit traces.

* * * * *